United States Patent [19]

Alter

[11] 4,149,177

[45] Apr. 10, 1979

[54] METHOD OF FABRICATING CONDUCTIVE BURIED REGIONS IN INTEGRATED CIRCUITS AND THE RESULTING STRUCTURES

[75] Inventor: Martin J. Alter, Sunnyvale, Calif.

[73] Assignee: Fairchild Camera and Instrument Corporation, Mountain View, Calif.

[21] Appl. No.: 720,550

[22] Filed: Sep. 3, 1976

[51] Int. Cl.² ............................................. H01L 27/04
[52] U.S. Cl. ........................................ 357/50; 357/23; 357/34; 357/46; 357/52; 357/55; 357/56
[58] Field of Search ........................ 357/23, 50, 49, 34, 357/46, 52, 55, 56

[56] References Cited

U.S. PATENT DOCUMENTS

| | | | |
|---|---|---|---|
| 3,648,125 | 3/1972 | Peltzer | 357/50 |
| 3,975,752 | 8/1976 | Nicolay | 357/22 |

*Primary Examiner*—Edward J. Wojciechowicz
*Attorney, Agent, or Firm*—Alan H. MacPherson; Robert C. Colwell; Paul J. Winters

[57] ABSTRACT

In an oxide isolated semiconductor structure having an epitaxial layer formed on a monocrystalline substrate, a buried, laterally extending, PN junction in said structure, and oxidized isolation regions extending through said epitaxial layer to said PN junction, thereby to form a plurality of electrically isolated pockets of semiconductor material, a dopant is located in those regions of the semiconductor material directly adjacent the oxidized isolation regions. This dopant is often referred to as the field predeposition.

The processes which result in the subsequent formation of insulating material to create isolated epitaxial pockets also result in the formation of a conductive buried region resulting from that portion of the field predeposition between the epitaxial pockets and portions of the wall of the insulating material. If desired, a collector sink then may be formed in the epitaxial pocket without disrupting the function of the conductive buried region. Among other embodiments, the conductive buried region may function as a collector sink bypass to allow manufacture of smaller memory circuits than those heretofore available.

42 Claims, 10 Drawing Figures

METHOD OF FABRICATING CONDUCTIVE BURIED REGIONS IN INTEGRATED CIRCUITS AND THE RESULTING STRUCTURES

BACKGROUND OF THE INVENTION

1. Field of the Invention

This invention relates to semiconductor devices and in particular to intregrated circuit structures.

2. Prior Art

Numerous techniques for electrically isolating semiconductor structures have been developed and are well-known in the art of semiconductor fabrication. See, e.g., A. H. Agajanian, "A Biography on Semiconductor Device Isolation Techniques," *Solid State Technology*, April, 1975. Also well-known are methods of forming oxidized isolation in integrated circuit structures. For example, U.S. Pat. No. 3,648,125 entitled "Method of Fabricating Integrated Circuits with Oxidized Isolation and the Resulting Structure" issued Mar. 7, 1972, to Douglas L. Peltzer (hereinafter referred to as the Peltzer patent) discloses techniques for fabricating substantially smaller transistors, diodes, and resistors than the then existing prior art. In one such technique disclosed by the Peltzer patent, an epitaxial layer of silicon is formed on a silicon substrate and divided into electrically isolated pockets by a grid of oxidized regions of the silicon material. The oxidized regions, commonly called field regions, penetrate the epitaxial silicon to contact a laterally extending PN junction. Active and/or passive components such as diodes, transistors, and resistors may be formed in the electrically isolated pockets.

In the fabrication of vertical transistors according to the Peltzer patent and using a P type substrate and a P type epitaxial layer, a buried layer of N conductivity type semiconductor material formed in selected locations between the substrate and the epitaxial silicon layer may serve as a collector. In one embodiment, one or more emitters may then be formed by diffusion or otherwise introducing suitable impurities into the upper surface of the epitaxial silicon. The epitaxial silicon material beneath the emitter, but above the collector, functions as the base of the transistor. Ohmic contact with the buried collector regions may be achieved by any of several well-known techniques. For example, a predeposition of a desired impurity into selected regions of the expitaxial silicon followed by a diffusion of the impurity through the expitaxial silicon until the impurity contacts the buried collector can convert the selected regions of the epitaxial silicon to the same conductivity type as the buried collector, thereby providing an ohmic connection.

One problem arising in the manufacture of integrated circuits which utilize various embodiments of the oxide isolation techniques disclosed in the Peltzer patent and elsewhere is channel inversion or MOS channeling. Channel inversion may occur in oxide isolated integrated circuit structures between adjacent, but noncontiguous N type buried collector regions. Usually occurring at the interface between the P type silicon and the overlying oxide, channel inversion results from a variety of causes, for example from the presence of impurities in the oxide, typically sodium ions having a net positive charge which "mirror," or attract, electrons in the underlying P type silicon. If enough electrons are attracted, a very thin region of the P type silicon will be converted to N type semiconductor material, creating an N type channel between the adjacent buried collector regions. Channel inversion causes theoretically isolated collector regions to be effectively electrically connected to each other, thereby degrading or thwarting the function of the device and/or circuit. Channel inversion usually cannot be completely prevented by forming oxide of high purity, as only a few parts per billion of sodium impurity in the oxide may be sufficient to cause channel inversion.

Channel inversion has been studied most frequently in conjunction with the manufacture of MOS transistors in which it is necessary to prevent unwanted leakage currents and to control threshold voltages. Three of the standard MOS techniques for preventing channel inversion are: (1) channel stops (which are heavily doped regions adjacent selected surfaces), (2) other forms of surface doping control, and (3) phosphorus gettering of sodium impurities in surface oxides.

One other well known technique for preventing channel inversion is the formation of a guard ring surrounding selected regions of the integrated circuit structure. The guard ring is created by diffusing, or otherwise inserting, an impurity of a selected conductivity type into desired locations of the semiconductor material.

A further technique for preventing channel inversion has been employed by B. T. Murphy at Bell Laboratories, and is discussed in W. J. Evans et al, "Oxide Isolated Monolithic Technology and Applications," IEEE Journal of Solid-State Circuits, Vol. SC-8, No. 5, October 1973. This reference discloses that after completely forming the oxide isolation for a given device, gallium or some other material is diffused through the oxide to strongly dope (with material of opposite conductivity type to the buried collector region) those regions of semiconductor material adjacent to the oxide, thereby preventing channel inversion.

SUMMARY OF THE INVENTION

Applicant has discovered that the formation, by whatever means, of a selectively doped region adjacent to the insulating material, when used with oxide isolated integrated circuit structures and conventional techniques of forming electrical contact to buried collectors in such structures, makes possible the creation of novel collector sink bypasses and resistors having a higher resistivity per unit length than resistors previously available. Applicant calls these regions, when designed for use and/or used as described in this specification, "conductive buried regions."

The structures of this invention typically utilize annular-shaped conductive buried regions in juxtaposition to collector sinks produced by selected oxide isolation processes. The word "annular," used herein in a much broader sense than conventionally used, refers to a closed path, sometimes a toroid, but more typically nontoroidal (for example, elliptical, oval, rectangular, square, etc.) and without regard to uniformity of cross-section. These annular-shaped conductive buried regions will usually be referred to herein as being a portion of the region formed by what is commonly referred to in the semiconductor processing arts as a "field predeposition." The term "field predeposition," however, is not intended to limit the methods by which these conductive buried regions are formed. For example, diffusion, or, in certain circumstances, ion implantation, or any other suitable process such as a combination of diffusion and ion implantation techniques, may be utilized to form these regions. When fabricated utilizing a region formed by "field predeposition," the annular-shaped "conductive buried region" is electrically isolated from other regions formed by the field predeposition process when the oxide isolation or other insulating material is formed and extended to the buried collector. Suitable control of the etching of the epitaxial silicon prior to field oxide formation together with appropriately long thermal diffusion of the collector sink may totally eliminate the conductive buried region. That is, the impurity concentration of the conductive buried region is everywhere overcompensated by the impurity concentration of the collector sink. In the prior art, this overcompensation was not undesirable.

Because in many embodiments of this invention the impurity concentration of the conductive buried region will be greater than the impurity concentration of the epitaxial layer, diffusion of the collector sink through the conductive buried layer will occur at a slower rate than diffusion through the epitaxial material. This featured provides a type of "fail-safe" protection for the conductive buried region by broadening the tolerances with which it is necessary to control diffusion of the collector sink so as not to eradicate the conductive buried region.

In the formation of isolated pockets of epitaxial silicon in oxide isolated integrated circuit structures, after definition of the buried collector layer (also often referred to as "buried layer," as to be distinguished from what Applicant refers to as conductive buried regions), formation of the epitaxial layer and formation of an oxidenitride masking layer on the epitaxial silicon, grooves or depressions are created in the epitaxial silicon where isolation regions are to be formed. The thereby exposed surface regions of epitaxial silicon are doped with an impurity selected to create in these surface regions a conductivity type opposite the conductivity type of the buried layer. After formation of the field oxide by oxidation of these exposed, doped surface regions of epitaxial silicon, significant amounts of the selected impurity have migrated to the regions of silicon material (either epitaxial or monocrystalline) directly adjacent the oxide. The regions of silicon material containing predominantly this impurity between the buried layer and the surface of the epitaxial layer comprise the conductive buried regions of this invention. The non-field regions of the epitaxial and underlying silicon contain the electrically isolated pockets of silicon in which active and/or passive devices are formed.

In one embodiment the substrate silicon is P type semiconductor material and the exposed surfaces of the grooves are doped with P type impurities and then oxidized to produce the field oxide. The field oxide is formed so as to contact the buried collector and thereby isolate pockets of semiconductor material. Thus, that portion of the conductive buried region adjacent each pocket and above the buried layer is isolated electrically from the remaining portions of the silicon material containing predominantly the selected P type impurity. These remaining portions are usually in the substrate. Typically, the conductive buried region will be adjacent the nonhorizontal portion of the groove walls from which it has been diffused or otherwise introduced. This conductive buried region can comprise, and indeed sometimes will be referred to as a "walled" resistor, although, as will be explained, the conductive buried region can be utilized in many different ways not usually associated with the term "resistor", for example, as a sink bypass, or, in general, as a conductor of electrical current. Numerous other embodiments of the above described structure may be fabricated in which the substrate is either P or N type material, the epitaxial layer P type or N type, and the impurity dopant P type or N type. Particularly useful embodiments are those in which the buried layer is of chosen conductivity type, while the semiconductor substrate and conductive buried region are of opposite conductivity type.

The conductive buried region of this invention is typically electrically isolated from other portions of the region resulting from the field predeposition by the oxide isolation-buried collector interface. That is, the impurity dopant concentration of that portion of the semiconductor surface, which, when oxidized, intersects the buried collector, is overcompensated by the impurity concentration of the buried collector. In other embodiments only selected portions of the conductive buried region will be isolated. In still further embodiments, for example, when an N type epitaxial layer is utilized with a P type field predeposition, or vice versa, formation of a collector sink is not necessary to electrically isolate the annular region of field predeposition from the remainder of the epitaxial material.

The conductive buried region of this invention has numerous applications which provide substantial advantages over prior-art integrated circuit structures. Collector sink bypasses can be formed to electrically connect regions on opposite sides of a collector sink which would otherwise be electrically isolated from each other. As will be discussed, the structure of this invention allows fabrication of memory circuits which occupy approximately one-half to two-thirds of the wafer surface area of memory circuits currently being built using oxide isolation techniques. In general, this invention allows formation of integrated circuits of smaller size, higher speed, and higher packing density than heretofore available.

Numerous resistor configurations may be created utilizing this invention. For example, conductive buried regions having high-resistivity may be formed which occupy substantially less wafer surface area than prior art high-resistivity resistors. This advantage results at least in part from the independence of the walled resistor or buried conductive region from optical masking technology. That is, the cross-sectional dimensions of the conductive buried region are primarily dependant upon suitable control of process parameters rather than masking tolerances, thereby facilitating close control of resistance per unit length. Suitable control of fabrication processes also allows creation of buried conductive regions having large resistances per unit length, a substantial advantage in the fabrication of large arrays of active devices in which the current in any one device must be low. Achieving low currents with conventional straight-line resistors required large fractions of the overall wafer surface.

DESCRIPTION OF THE DRAWINGS

FIGS. 1, 2 and 3 depict simplified cross sectional views of one embodiment of the semiconductor structure of this invention at various stages of the fabrication process. FIG. 4 depicts a simplified plan view of the semiconductor structure, while FIG. 4b is a cross-sectional view taken through FIG. 4a at section 4b. FIG. 4b shows a portion of the structure shown in FIG. 4a. FIG. 5 is also a cross-sectional view of the semiconductor structure.

DETAILED DESCRIPTION

Figure 1:
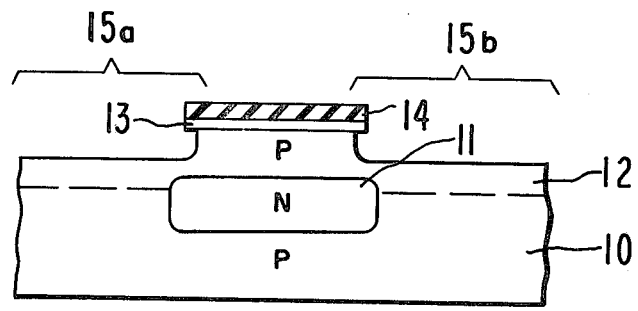
FIGS. 1 through 5 illustrate a process by which this invention is formed, and one structure of the invention; In particular

The semiconductor structure of this invention is fabricated utilizing the process depicted in FIGS. 1 through 5. The structure shown in FIG. 1 may be fabricated in the following well known manner:

1. Oxidize P substrate 10.
2. Mask and diffuse N type regions 11 which serve as buried collectors and isolation regions.
3. Remove the oxide (not shown) and grow a thin P type silicon epitaxial layer 12.
4. Thermally grow oxide layer 13, deposit silicon nitride layer 14, and mask both layers by conventional techniques.
5. Etch field isolation regions 15a and 15b.

Figure 2:
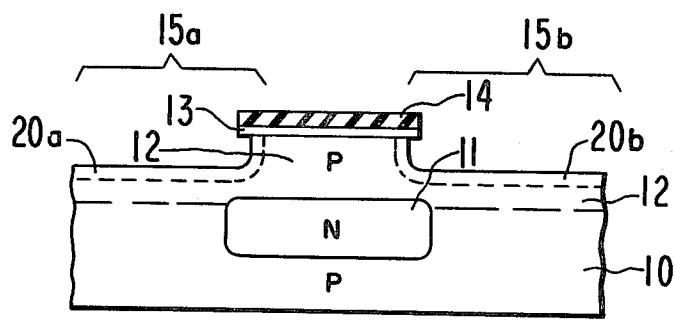

In FIG. 2 a field predeposition 20a and 20b of P+ type semiconductor material has been introduced into the exposed surfaces of epitaxial layer 12. This may be accomplished by diffusion, in certain circumstances, by ion implantation, or by any other suitable process. Note that the field predeposition is masked from a substantial portion of the epitaxial silicon 12 in that region directly beneath the oxide layer 13. As has been discussed, one purpose of field predeposition 20 is to prevent channel inversion between adjacent buried collector regions, for example, between region 11 and the next adjoining buried collector (not shown). The P+ type semiconductor material 20a and 20b increases the doping concentration at the surface regions of grooves 15a and 15b to prevent channel inversion after subsequent formation of the field oxide. Accordingly, the field predeposition region 20a and 20b is of differing conductivity from surrounding regions. For example, in some embodiments field predeposition 20 will be of higher conductivity than adjacent semiconductor material, while in other embodiments it will be of different conductivity type. Other uses of the field predeposition are discussed below.

Figure 3:
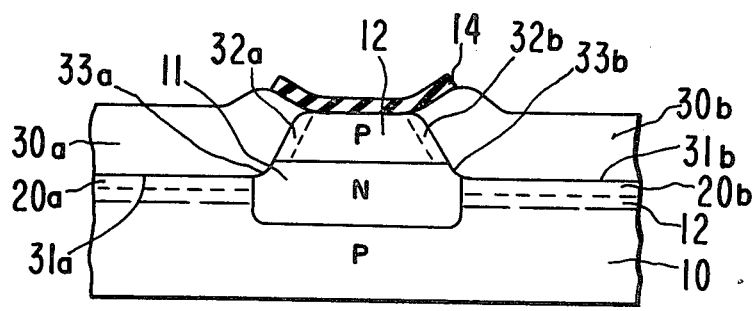

After formation of the field oxide regions 30a and 30b according to well-known techniques the semiconductor structure of this invention is shown in FIG. 3. Because the volume of the silicon dioxide which typically comprises region 30a and 30b is greater than the volume of the epitaxial silicon from which it is formed, the edges of silicon nitride layer 14 are lifted and a "bird-beak" shape is created similar to that depicted in FIG. 3. Because the field isolation 30a and 30b is typically formed by a thermal oxidation process, a portion of the dopant in the P+ doped field predeposition region 20a and 20b diffuses into the epitaxlial layer 12 ahead of the silicon dioxide-silicon inter-face 31a and 31b.

When a sufficient amount of oxide has been formed to extend through the epitaxial layer 12 to contact buried collector region 11, a portion 32a and 32b of the field predeposition will be electrically isolated from the remainder of the region of the field predeposition 20a and 20b, although not electrically isolated from epitaxial layer 12. The isolated portion 32a and 32b of the field predeposition will be primarily adjacent to the nonhorizontal portion of the silicon dioxide-epitaxial silicon interface 31a and 31b. As previously discussed the isolated portion 32a and 32b of the field predeposition region will be referred to as a conductive buried region, or in some embodiments as a "walled" resistor.

Conductive buried regions 32a and 32b usually will be electrically isolated from other portions of the field predeposition 20a and 20b by the field oxide-buried collector interface 33a and 33b. This electrical isolation occurs because the impurity concentration of the buried collector region 11 overcompensates the impurity concentration of field deposition region 20a and 20b in those regions 33a and 33b where regions 20a and 20b intersect the buried collector 11. The resistance per unit length of the walled resistor 32a and 32b may be controlled by the concentration and depth of the field predeposition, and by the extent to which a collector sink, if formed, encroaches upon the conductive buried region. In other embodiments, the conductive buried region may be electrically isolated from the epitaxial layer by selecting appropriate conductivity type materials, for example, use of a chosen conductivity type material for the epitaxial layer and an opposite conductivity for the field predeposition.

Figure 4:
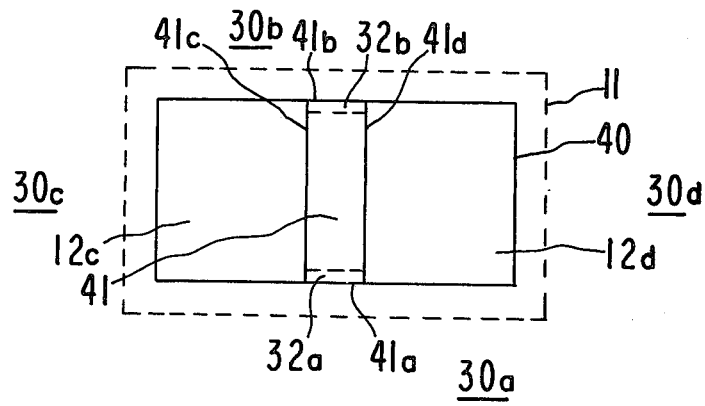

In one embodiment of this invention silicon nitride layer 14 is then partially removed wherever collector sink depositions are desired. Following partial removal of silicon nitride layer 14, the appearance of a plan view of the structure formed according to the process of this invention is shown in FIG. 4. Note that the field isolation 30a, 30b, 30c and 30d completely surrounds the perimeter of electrically isolated pocket 40. The perimeter of buried collector 11 is indicated on FIG. 4. FIG. 4 also depicts the appearance of the wafer surface following formation of collector sink 41. Collector sink 41 will usually be formed with an N type semiconductor material predeposition and diffusion, although other well-known processes are also suitable.

With appropriately controlled etching and thermal diffusion processes, the N type impurity which forms collector sink 41 for contact to buried collector 11, will not penetrate into the perimeter of epitaxial layer 12 immediately above buried layer 11. This effect is shown in FIG. 4a; see regions 32a and 12a.

Because of the above described phenomenon, conductive buried regions 32a and 32b (see FIGS. 4, 4a and 4b) are not overcompensated by the impurity used to control the conductivity type of collector sink 41. Accordingly, conductive buried regions 32a and 32b provide an electrically isolated conducting path between regions 12c and 12d which are disposed on opposite sides of collector sink 41. This embodiment of conductive buried regions 32a and 32b which provides a conducting path around the collector sink 41 will be referred to herein as a collector sink bypass.

The conductive buried region of this invention may be fabricated in embodiments having a wide range of shapes and dimensions. For example, a collector sink depth to the buried collector of 1.2 microns and an oxide isolation depth to the epitaxial silicon of 1.8 microns (both as measured down from the wafer surface) have been found to produce suitable results and can be achieved by a variety of combinations of process parameters.

Figure 4A:
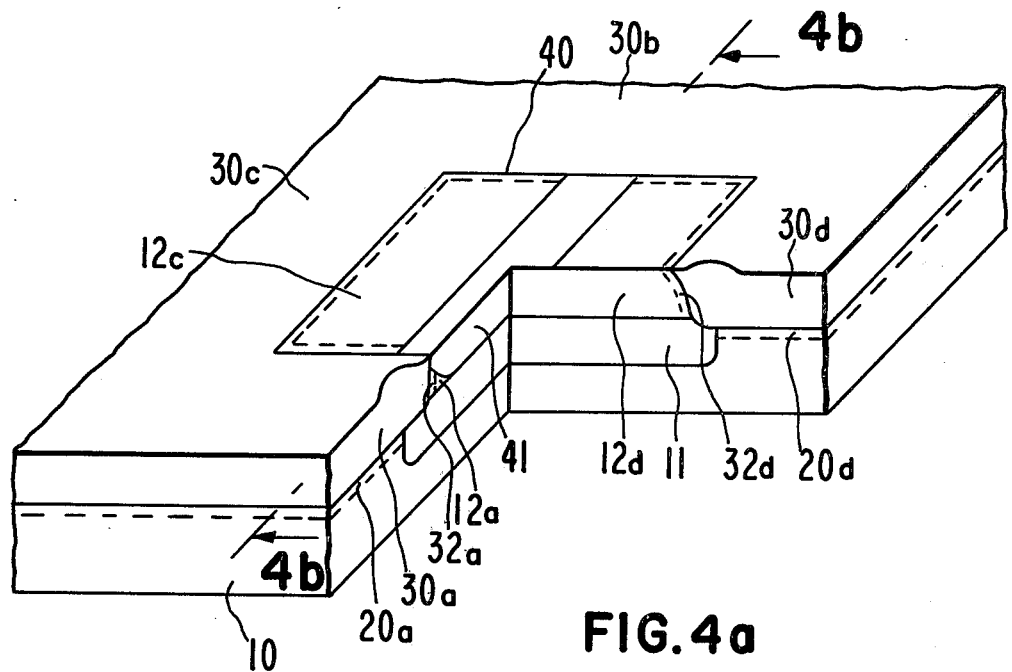
FIG. 4a is a perspective view of the structure showing a sectional line 4b which is the basis for FIG. 4b.
Figure 4B:
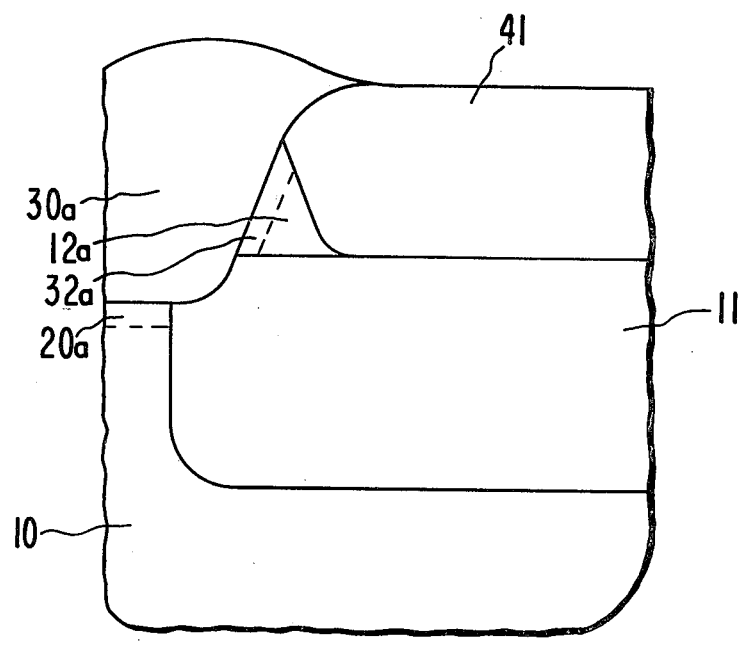

FIG. 4a shows a cross-section of the wafer shown in FIG. 4, together with conductive buried region or collector sink bypass 32a, field oxide isolation 30a, 30b, 30c and 30d, buried collector 11, and field predeposition 20a and 20d. An additional collector sink bypass (32b) will also be present at the opposite end of collector sink bypass (32b) is not shown in FIG. 4a. Silicon nitride layer 14 is not shown in FIG. 4a, but if shown it would overlie regions 12c and 12d. An enlarged view of a portion of FIG. 4a is shown in FIG. 4b.

Figure 5:
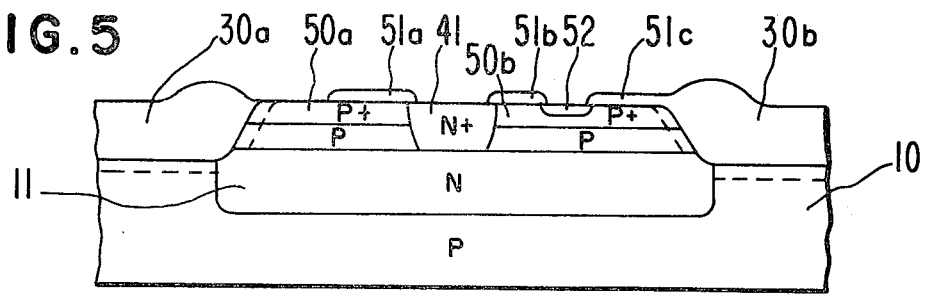

The semiconductor structure shown in FIGS. 3, 4 and 4a may be subjected to various well-known semiconductor manufacturing processes to obtain the structure shown in FIG. 5. For example, the structure shown in FIG. 5 may be obtained from that shown in FIGS. 3, 4, 4a and 4b by the following steps:

1. Perform base mask to remove silicon nitride layer 14 from regions 12c and 12d (see FIG. 3).
2. Perform base predeposition and diffusion thereby forming regions 50a and 50b, thereby also forming oxide layer 51, of which parts 51a, 51b and 51c are shown. Oxide layer 51 (FIG. 5) is formed on regions 12c, 12d and 41 (FIG. 4a). Oxide layer 51 may also be formed on insulated material 30.
3. Mask emitter region 52 thereby providing the opening between oxide layer portions 51b and 51c, also reopening between oxide layer portions 51a and 51b to provide an opening to collector sink contact region 41.
4. Perform the emitter diffusion, resulting in washed emitter 52 and its equivalent in region 41.
5. Mask additional contact opening in oxide layer 51 between insulating material 30a and oxide layer portion 51a.
6. Deposit metal interconnect layer and mask interconnect pattern (not shown). Typically, aluminum-silicon or its equivalent is employed when washed emitters have been formed.

The conductive buried regions 32a (FIGS. 4a and 4b) and 32b (not shown) allow electrical contact to the base region 50b (FIG. 5) to be made at region 50a (FIG. 5), as regions 50a and 50b are electrically connected by conductive buried regions 32a and 32b.

Although the structure of this invention has been discussed in conjunction with specific conductivity type materials, opposite conductivity type semiconductor materials may be substituted for those specified in each embodiment. For example, an N type epitaxial layer may be formed rather than the P type layer described, and the conductivity types of all other regions of the semiconductor structure suitably altered, although in some embodiments the conductivity type of only selected regions need be changed. Additionally, the conductive buried region of this invention may be electrically isolated without a collector sink by forming it in an epitaxial layer of opposite conductivity type to the field predeposition.

Figure 6:
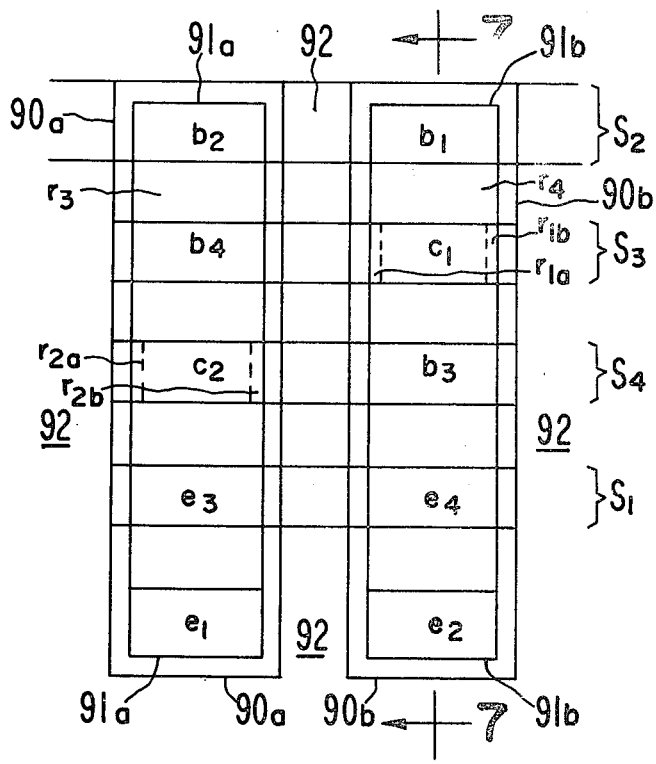
FIGS. 6 and 7 are respectively plan and cross-sectional views of a memory cell utilizing conductive buried regions.
Figure 8:
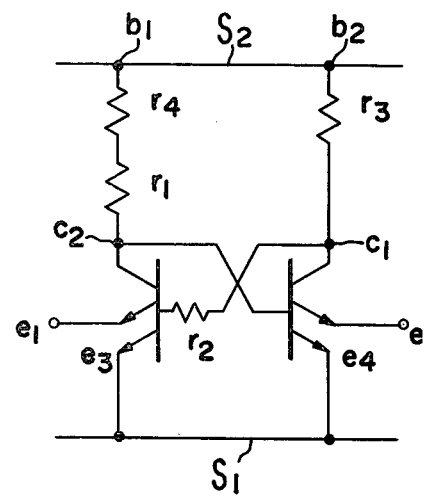
FIG. 8 is a schematic diagram of the memory cell shown in FIGS. 6 and 7.
Figure 7:
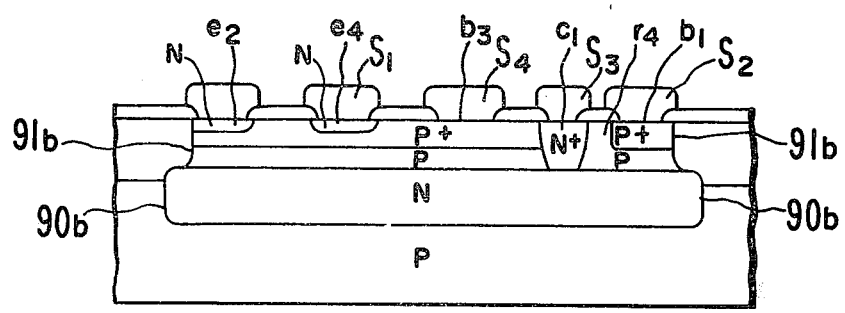

Another embodiment of this invention is depicted in FIGS. 6, 7 and 8. The embodiment therein shown may be readily formed utilizing well-known semiconductor manufacturing techniques and those techniques discussed herein in conjunction with FIGS. 1-5. FIG. 6 is a plan view of an integrated circuit memory cell of substantially smaller size and higher packing density than available with prior art devices. Active and passive semiconductor devices are formed within the perimeters of the two electrically isolated silicon pockets 91a and 91b. The perimeters of the two buried collectors 90a and 90b are shown, as is field oxide isolation 92. Regions $e_1$, $e_2$, $e_3$, and $e_4$ are emitters for two transistors, and emitters $e_3$ and $e_4$ are ohmically connected by conductor $s_1$. Resistor contacts $b_1$ and $b_2$ are shown, as is the metal connection $s_2$ between them. Also shown are transistor base contacts $b_3$ and $b_4$, and collector contacts $c_1$ and $c_2$. Ohmic connections $s_3$ and $s_4$ serve to electrically connect region $b_4$ with region $c_1$, and region $c_2$ with region $b_3$, respectively. Region $b_1$ is electrically connected first be epi resistor $r_4$, then by conductive buried regions or walled resistors $r_{1a}$ and $r_{1b}$, to region $b_3$. Epi resistors $r_3$ and $r_4$ and walled resistors $r_{2a}$ and $r_{2b}$ are also depicted.

A cross-section of the semiconductor structure of FIG. 6 is shown in FIG. 7. All components are given identical designations. Similarly, FIG. 8 shows a schematic of the memory cell which results from the semiconductor structure depicted in FIGS. 6 and 7. The electrical connections, components and structure shown schematically in FIG. 8 are given the same designations as in FIGS. 6 and 7.

The highly compact cell design depicted in FIG. 6 and FIG. 7 and shown schematically in FIG. 8 is made possible by this invention. With this invention conductive buried regions or walled resistors $r_{1a}$, $r_{1b}$, $r_{2a}$ and $R_{2b}$ are created which bypass the collector sinks $c_1$ and $c_2$. This feature provides a substantial reduction in wafer surface area over prior art memory cells. In prior art memory cells utilizing a plurality of transistors it was necessary to locate collector sinks such as $c_1$ and $c_2$ noncollinearly from the other components since no collector sink bypass was possible. Particularly, prior art devices provided greater separation between electrically isolated pockets 91a and 91b so that collector sinks $c_1$ and $c_2$ would be disposed between regions 91a and 91b. The shape of the perimeters 90a and 90b of the buried collectors would be altered accordingly. Such a structure is depicted in W. D. Baker and D. A. Laws, "The Isoplanar Process", Fairchild Semiconductor Advertising Brochure, October, 1971.

In any of the above discussed applications or embodiments, the cross-sectional dimensions of the conductive buried layer or walled resistor formed according to this invention are largely independent of optical masking technology. The width of the walled resistor, as measured from the buried collector upward along the field oxide wall, is controlled by the thickness of the epitaxial layer. The thickness of the walled resistor, as measured perpendicular to the oxide wall, may be controlled by varying the depth and concentration of the field predeposition and the collector sink diffusion.

While certain embodiments of this invention have been described herein, other related structures and processes will be obvious in view of this disclosure. In particular, structures embodying semiconductor materials having complementary conductivity types to those described in this specification and depicted in the drawings can be obtained by reversing the conductivity type of each region in each structure.

What is claimed:
1. A structure comprising:
   a semiconductor silicon substrate;
   a semiconductor silicon epitaxial layer disposed upon one surface of said substrate;
   a buried layer formed between selected portions of the substrate and the epitaxial layer to thereby create a laterally extending PN junction forming an isolation barrier between regions of said substrate and epitaxial layer;
   said epitaxial layer including at least one epitaxial silicon pocket electrically isolated from surrounding regions of the epitaxial layer by an annular- shaped region of insulating material extending through said epitaxial layer to said PN junction;

a sink region of differing conductivity from said epitaxial layer formed in said at least one silicon pocket;

a conductive buried region disposed in the pocket adjacent selected portions of said annular-shaped region of insulating material and adjacent the intersection of the epitaxial layer and the buried layer.

2. Structure as in claim 1 wherein the conductive buried region is formed in the epitaxial layer.

3. Structure as in claim 1 wherein the conductive buried region is of differing conductivity from the epitaxial layer.

4. Structure as in claim 1 wherein the substrate and the epitaxial layer are the same conductivity type.

5. Structure as in claim 4 wherein the substrate is P conductivity type.

6. Structure as in claim 4 wherein the substrate is N conductivity type.

7. Structure as in claim 1 wherein the substrate and the epitaxial layer are opposite conductivity type.

8. Structure as in claim 7 wherein the substrate is P conductivity type.

9. Structure as in claim 7 wherein the substrate is N conductivity type.

10. Structure as in claim 1 wherein the conductive buried region and the sink region are the same conductivity type.

11. Structure as in claim 10 wherein the sink region is N conductivity type.

12. Structure as in claim 10 wherein the sink region is P conductivity type.

13. Structure as in claim 1 wherein the conductive buried region and the sink region are opposite conductivity type.

14. Structure as in claim 13 wherein the sink region is P conductivity type.

15. Structure as in claim 13 wherein the sink region is N conductivity type.

16. Structure as in claim 1 wherein the conductive buried region and the epitaxial layer are the same conducitivty type.

17. Structure as in claim 16 wherein the epitaxial layer is P conductivity type.

18. Structure as in claim 16 wherein the epitaxial layer is N conductivity type.

19. Structure as in claim 1 wherein the conductive buried region and the epitaxial layer are opposite conductivity type.

20. Structure as in claim 19 wherein the epitaxial layer is P conductivity type.

21. Structure as in claim 19 wherein the epitaxial layer is N conductivity type.

22. Structure as in claim 1 wherein:
the PN junction is the junction between the buried layer of semiconductor material and the substrate, said buried layer being opposite conductivity type to the epitaxial layer, and being disposed between the substrate and the epitaxial layer, and the insulating material is an oxide of silicon.

23. Structure as in claim 22 wherein the buried layer is P conductivity type.

24. Structure as in claim 22 wherein the buried layer is N conductivity type.

25. At least one structure as in claim 22 wherein:
the at least one epitaxial silicon pocket is divided into two parts by the sink, the sink separating the first part from the second part; and
the sink is the same conductivity type as the buried layer.

26. At least one structure as in claim 25 wherein at least one emitter is formed in the second part, and
the conductive buried region electrically connects the first part to the second part.

27. Structure as in claim 26 wherein separate electrical connections are made to each of the first part, the at least one emitter, and the sink region.

28. At least one structure as in claim 27 wherein two emitters are formed in the second part.

29. A single structure as in claim 28 wherein:
two separate electrical connections are made to the first part, and
all of the electrical connections are substantially collinear.

30. A single structure as in claim 28 wherein:
a separate electrical connection is made to the second part, and said connection is
substantially collinear with the electrical connections made to the first part.

31. A first and a second structure as in claim 26 wherein:
the first structure and the second structure are separated by a region of insulating material; and
as to the first structure:
a first and a second emitter are formed in the second part thereof,
a first electrical connection is made to the first emitter,
a second electrical connection is made to the second emitter,
a third electrical connection is made to the sink,
a fourth and a fifth electrical connections are made to the first part; and
as to the second structure:
a first and a second emitter are formed in the second part thereof,
a sixth electrical connection is made to the first emitter,
a seventh electrical connection is made to the second emitter,
an eighth electrical connection is made to the second part,
a ninth electrical connection is made to the sink, and
a tenth electrical connection is made to the first part.

32. A first and a second structure as in claim 31 wherein:
the first through fifth connections are collinear, and
the sixth through tenth connections are collinear.

33. A first and a second structure as in claim 32 wherein:
the second and seventh connections are themselves connected by first means,
the third and eighth connections are themselves connected by second means,
the fourth and ninth connections are themselves connected by third means, and
the fifth and tenth connections are themselves connected by fourth means.

34. A first and a second structure as in claim 33 wherein the first through fourth means are substantially linear and parallel metal connections.

35. Structure as in claim 1 wherein the conductive buried region is annular-shaped.

36. Structure as in claim 35 wherein the upper surface of the insulating material is substantially planar.

37. Structure as in claim 36 wherein the conductive buried region and the epitaxial layer are both formed from P conductivity type material.

38. A semiconductor structure as in claim 1 wherein the conductive buried region is adapted for electrically connecting one portion of a circuit to another portion of a circuit.

39. Structure as in claim 38 wherein both portions of the circuit are adjacent to a collector sink.

40. An improved semiconductor structure including a semiconductor silicon substrate, a semiconductor silicon epitaxial layer disposed upon one surface of said substrate, a buried layer formed between selected portions of said substrate and said epitaxial layer to thereby create a laterally extending PN junction forming an isolation barrier between regions of said substrate and epitaxial layer, said epitaxial layer including at least one epitaxial silicon pocket electrically isolated from surrounding regions of the epitaxial layer by an annular-shaped region of insulating material extending through said epitaxial layer to said PN junction wherein the improvement comprises:
a conductive buried region of differing conductivity from said at least one epitaxial silicon pocket disposed in the pocket adjacent selected portions of said annular-shaped region of insulating material and adjacent the intersection of the buried layer with the epitaxial layer, and
a sink region of differing conductivity from said epitaxial layer formed in said at least one silicon pocket.

41. Structure as in claim 40 wherein the conductive buried region is also disposed between selected portions of the sink region and the insulating material.

42. A method of fabricating a semiconductor structure comprising:
forming an isolation PN junction in a semiconductor substrate;
forming an epitaxial layer on said substrate;
introducing first dopant into first regions of said epitaxial layer;
forming annular-shaped regions of insulating material on said first regions, said insulating material extending through said epitaxial layer to contact said PN junction, thereby creating electrically isolated pockets in the epitaxial layer;
introducing second dopant into said electrically isolated pockets to overcompensate said first dopant at the surface of said pocket, but not to overcompensate said first dopant everywhere else in said pocket, thereby to form in the epitaxial layer adjacent to the insulating material, a path of greater conductivity than said epitaxial layer

* * * * *